United States Patent
Seddon (10) Patent No.: US 11,972,980 B2
(45) Date of Patent: Apr. 30, 2024

(54) SINGULATION SYSTEMS AND RELATED METHODS

(71) Applicant: SEMICONDUCTOR COMPONENTS INDUSTRIES, LLC, Phoenix, AZ (US)

(72) Inventor: Michael J. Seddon, Gilbert, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 227 days.

(21) Appl. No.: 17/104,302

(22) Filed: Nov. 25, 2020

(65) Prior Publication Data

US 2022/0165622 A1    May 26, 2022

(51) Int. Cl.
  *H01L 23/48* (2006.01)
  *H01L 21/78* (2006.01)
  *H01L 21/683* (2006.01)

(52) U.S. Cl.
  CPC .......... *H01L 21/78* (2013.01); *H01L 21/6836* (2013.01); *H01L 2221/68327* (2013.01)

(58) Field of Classification Search
  CPC ..................................................... H01L 21/78
  See application file for complete search history.

(56) References Cited

U.S. PATENT DOCUMENTS

| | | | |
|---|---|---|---|
| 9,337,098 B1 | 5/2016 | Seddon et al. | |
| 10,607,889 B1 | 3/2020 | Seddon | |
| 2003/0189212 A1 | 10/2003 | Yoo | |
| 2005/0191951 A1* | 9/2005 | Sekiya | B24C 1/045 451/99 |
| 2009/0057843 A1* | 3/2009 | Kwang | H01L 25/105 257/E23.024 |
| 2012/0112340 A1* | 5/2012 | Lin | H01L 23/3114 257/734 |
| 2015/0091124 A1 | 4/2015 | Liu et al. | |
| 2019/0371667 A1* | 12/2019 | Westerman | H01L 21/6836 |

FOREIGN PATENT DOCUMENTS

EP          2434528 A1 *  3/2012  ....... H01L 21/67132

* cited by examiner

*Primary Examiner* — Mohammad M Choudhry
(74) *Attorney, Agent, or Firm* — Adam R. Stephenson, LTD.

(57) ABSTRACT

Implementations of a semiconductor substrate singulation process may include applying a fluid jet to a material of a die street of a plurality of die streets included in a semiconductor substrate where the semiconductor substrate may include: a plurality of die separated by the plurality of die streets; and a plurality of die support structures coupled thereto; and singulating the plurality of die and the plurality of die support structures at the plurality of die streets using the fluid jet. The fluid jet may be moved only along a length of the die street.

17 Claims, 5 Drawing Sheets

SINGULATION SYSTEMS AND RELATED METHODS

BACKGROUND

1. Technical Field

Aspects of this document relate generally to systems and methods used for singulating semiconductor substrates.

2. Background

Semiconductor substrates include materials that have semiconductor electrical properties. Semiconductor chips or die are formed using or on the material of the semiconductor substrates to take advantage of the electrical properties of the semiconductor materials to form the various electronic devices contained in the semiconductor die.

SUMMARY

Implementations of a semiconductor substrate singulation process may include applying a fluid jet to a material of a die street of a plurality of die streets included in a semiconductor substrate where the semiconductor substrate may include: a plurality of die separated by the plurality of die streets; and a plurality of die support structures coupled thereto; and singulating the plurality of die and the plurality of die support structures at the plurality of die streets using the fluid jet. The fluid jet may be moved only along a length of the die street.

Implementations of a semiconductor substrate singulation process may include one, all, or any of the following:

The fluid jet may be moved by moving the semiconductor substrate.

The fluid jet may be moved by moving the fluid jet relative to the semiconductor substrate.

The die support structure may include a mold compound.

The fluid jet may include a plurality of particles.

The fluid jet may be pulsed at a predetermined frequency.

The process may include at least a second fluid jet.

The process may include repeating applying the fluid jet to the material of the die street prior to singulating the plurality of die and the plurality of die support structures.

The spacing between the fluid jet and the second fluid jet may be a distance equal to a pitch of one of the plurality of die or a plurality of packages.

The fluid jet and the second fluid jet move along a length of the die street one of consecutively or sequentially.

Implementations of a semiconductor substrate singulation process may include applying a one of a fluid jet or a laser beam to a material of a die street of a plurality of die streets included in a semiconductor substrate, the semiconductor substrate including a plurality of die separated by the plurality of die streets; and die-by-die singulating the plurality of die and a plurality of die support structures at the plurality of die streets using the one of the fluid jet or the laser beam.

Implementations of a semiconductor substrate singulation process may include one, all, or any of the following:

The process may include a plurality of die support structures coupled to the plurality of die.

The plurality of die support structures and the plurality of die form a plurality of semiconductor packages.

Die-by-die singulating further may include intersecting one of a second fluid jet or a second laser beam with the one of the fluid jet for the laser beam at the beginning of singulating and at the ending of singulating each die of the plurality of die.

The fluid jet may include a plurality of particles.

Implementations of a semiconductor substrate singulation process may include applying a one of a fluid jet or a laser beam to a material of a die street of a plurality of die streets included in a semiconductor substrate, the semiconductor substrate including a plurality of die separated by the plurality of die streets; and zigzag singulating the plurality of die and the plurality of die support structures at the plurality of die streets using the one of the fluid jet or the laser beam.

Implementations of a semiconductor substrate singulation process may include one, all, or any of the following:

The process may include a plurality of die support structures coupled to the plurality of die.

The plurality of die support structures and the plurality of die form a plurality of semiconductor packages.

Zigzag singulating further may include intersecting one of a second fluid jet or a second laser beam with the one of the fluid jet for the laser beam at the beginning of singulating and at the ending of singulating each die of the plurality of die.

The fluid jet may include a plurality of particles.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended singulation systems and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such singulation systems and related methods, and implementing components and methods, consistent with the intended operation and methods.

Figure 1:
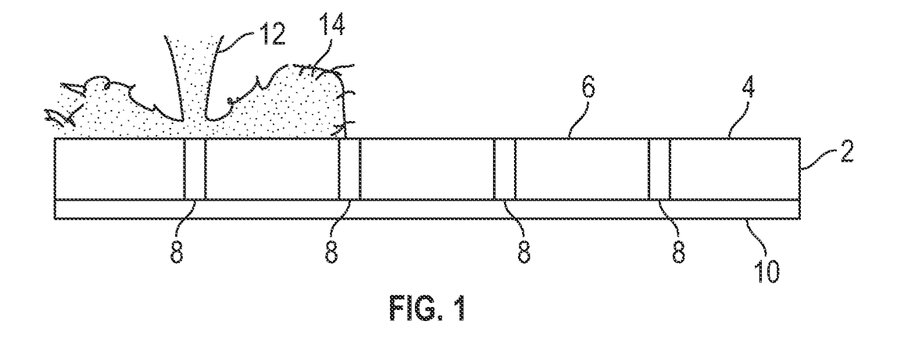
FIG. 1 is side view of a semiconductor substrate and a fluid jet with particles therein.

Referring to FIG. 1, an implementation of a semiconductor substrate 2 is illustrated. In various implementation, the semiconductor substrate 2 may include any of a wide number of semiconductor materials, such as, by non-limiting example, silicon, silicon dioxide, aluminum nitride, aluminum oxide, gallium arsenide, sapphire, ruby, silicon-on-insulator, or any other semiconductor material type. As illustrated, the substrate 2 includes a plurality of semiconductor die 4, 6 formed therein or thereon which are separated by a plurality of die streets 8. While the die streets 8 are shown as extending through the thickness of the material of the semiconductor substrate, in various implementation the die streets may not extend fully through the thickness of the semiconductor substrate. The die streets are formed for a variety of purposes including, by non-limiting example, to contain electrical test structures, semiconductor wafer alignment features, spacing to allow for singulation of adjacent die, die stacked reinforcement structures, or any other desired structure capable of performing a desired function for forming the die from the material of the semiconductor substrate 2.

The implementation of the semiconductor substrate to FIG. 1 is a thinned substrate meaning that the substrate was thinned using various thinning techniques (backgrinding, laser damage and ultrasonic separation, etc.) to reduce a thickness of the semiconductor substrate from an original thickness used for semiconductor device fabrication to a thickness desired for packaging and/or end-use. As illustrated, the plurality of die 4, 6 are coupled to a die support structure 10 which, in the view in FIG. 1, is illustrated as a continuous layer that extends across the plurality of die 6, 4 and the plurality of die streets 8. In various implementations, the actual structure of the die support structure 10 may take many different forms and shapes over each of the individual die 4, 6 when viewed from the top down such as, by non-limiting example, elliptical shapes, circular shapes, rectangular shapes, irregular shapes, combinations of shapes, closed shapes, or any other desired shape or structure capable of supporting the material of each of the plurality of die. In the implementation illustrated in FIG. 1, the material of the die support 10 extends across each of the plurality of die streets 8. However, in other implementations, the material of the die support 10 may not extend across material of one or more of the plurality of die streets 8. In other implementations, however, no die support 10 may be utilized. The use of die supports 10 may be used when the material of the semiconductor substrate 2 has been thinned to a degree that additional support for each of the plurality of die is desired before the die proceed to further packaging operations and/or are singulated.

In FIG. 1, a fluid jet 12 is illustrated focused over one of the plurality of die streets 8. In this implementation, the fluid jet 12 is a jet of water or a water jet. In this implementation, the water jet 12 includes a plurality of particles 14 represented as the dots in the water jet 12. In the various system and method implementations disclosed herein, the fluid jet 12 is used to cut through/abrade the material of the semiconductor substrate 2 and the die support 10 at/along each of the die streets 8 to singulate each of the plurality of die 4, 6 from each other. In those implementation where a die support 10 is not used, the fluid jet 12 is used to singulate the plurality of die 4, 6 through only the material of the semiconductor substrate 2. In various implementation, particles may not be included in the fluid jet 12. In other implementation, the fluid jet may not be water but may be some other fluid such as, by non-example, an oil, hydrocarbon, gas, air, nitrogen, a flame, an over-ventilated flame, an under-ventilated flame, a laminar flame, a plurality of ions in a carrier gas, a liquid containing an abrasive, a liquid containing an etchant, or any other fluid type comprising any type of material-removing/abrading component. In those implementations where an etchant is included, the etchant may be a composition designed to etch, by non-limiting example, metal, silicon, oxide, or any other components of the semiconductor wafer stack or substrate. In various implementations, the fluid jet may be pulsed during the singulation process at a particular frequency and/or amplitude. In various implementations, the pulsating may be created by varying a pumping pressure applied to the fluid of the fluid jet. In other implementations, the pulsing may be carried out by applying an ultrasonic or other sonic energy source to the fluid at a desired frequency or pattern of frequencies.

As illustrated in FIG. 1, the fluid jet 12 is focused over the material of the plurality of die streets 8. The fluid jet 12 is then moved along each of the plurality of die streets 8 to complete singulation of each of the plurality of die 4, 6 in the semiconductor substrate 2. In various method and system implementations disclosed herein, a wide variety of techniques and systems may be used to accomplish this die street level movement of the fluid jet 12 along the plurality of streets 8. For example, in one implementation, the fluid jet 12 may be physically moved along the die streets 8 while the semiconductor substrate 2 remains fixed to a support/chuck. In other implementation, the fluid jet 12 may be held stationary while the semiconductor substrate 2 is moved relative to the fluid jet 12. In other implementation, both the fluid jet 12 and the semiconductor substrate may be moved relative to one another to accomplish moving the waterjet along the material of the plurality of die streets 8. A wide variety of singulation paths along the die streets 8 may be devised and employed in various fluid jet singulation implementations disclosed in this document. Various versions of these will be discussed for the exemplary purposes of this disclosure in this document.

Figure 2:
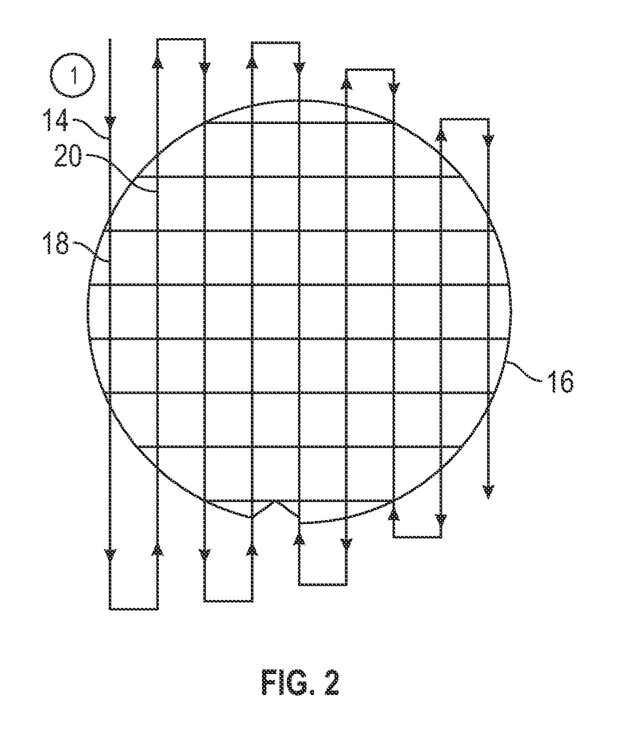
FIG. 2 is a top view of a singulation path implementation over the surface of a semiconductor substrate with a plurality of die streets formed therein.

Referring to FIG. 2, an implementation of a singulation path 14 indicated by indicator 1 is illustrated over an implementation of a semiconductor substrate 16. As illustrated, this implementation of a singulation path 14 is an alternating path that alternately moves in one direction across a first die street 18 and then moves in the opposite direction along another die street 20 until all of the die streets in either the vertical orientation have been singulated.

In this implementation, the direction of movement of the fluid jet is then changed to begin singulating in a horizontal direction and a corresponding alternate path until all of the die streets have been singulated using the fluid jet.

Figure 3:
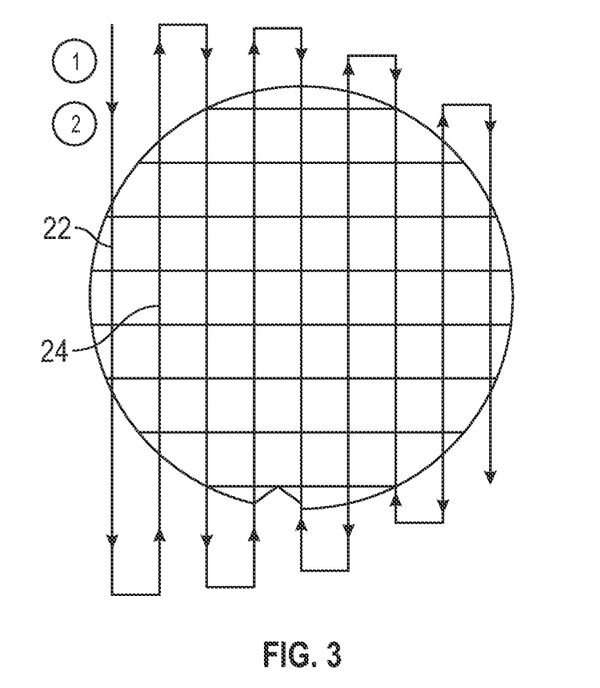
FIG. 3 is a top view of another singulation path implementation over the surface of the semiconductor substrate with a plurality of die streets formed therein.

In some method implementations, referring to FIG. 3, multiple passes along each die street may be employed to accomplish the singulation. As indicated in FIG. 3 the fluid jet does a first pass as indicated by indicator 1 and then does a second pass as indicated by indicator 2 along each of the die streets 22, 24 in the vertical direction. In this implementation, a similar multi-pass process may be used in the horizontal orientation for those die streets oriented horizontally after the vertically oriented die streets 22, 24 have been singulated. In these implementations, the fluid jet may have the same characteristics in the first pass in and in the second pass; in other implementation, the thinned fluid jet may have different characteristics than the first fluid jet. These characteristics may include any of the fluid jet characteristics/components disclosed herein. While a path with two passes is illustrated in FIG. 3, more than two passes may be employed in various implementations.

Figure 4:
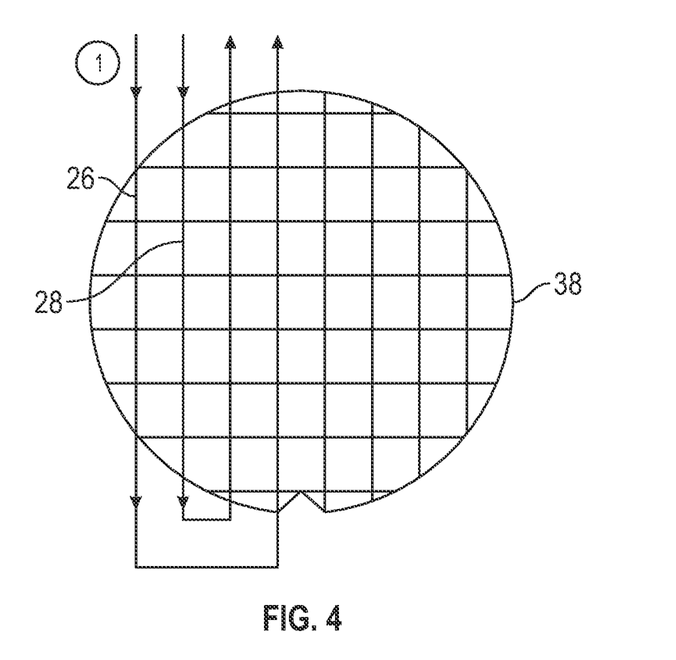
FIG. 4 is a top view of another singulation path implementation over the surface of the semiconductor substrate with a plurality of die streets formed therein.

In the singulation path implementations disclosed thus far, the path follows each adjacent street and each adjacent street is singulated one at a time. In the implementation illustrated in FIG. 4, however, two adjacent die streets 26, 28 are illustrated being cut by two simultaneously operating fluid jets at the same time moving in the same direction along with two adjacent die streets 26, 28 of the semiconductor substrate 30. In this implementation, the advantage may be higher throughput as multiple die streets can be cut at the same time. In various implementations of singulation paths that cut multiple die streets at the same time, both single pass and multi-pass may be employed during the singulation process.

Figure 5:
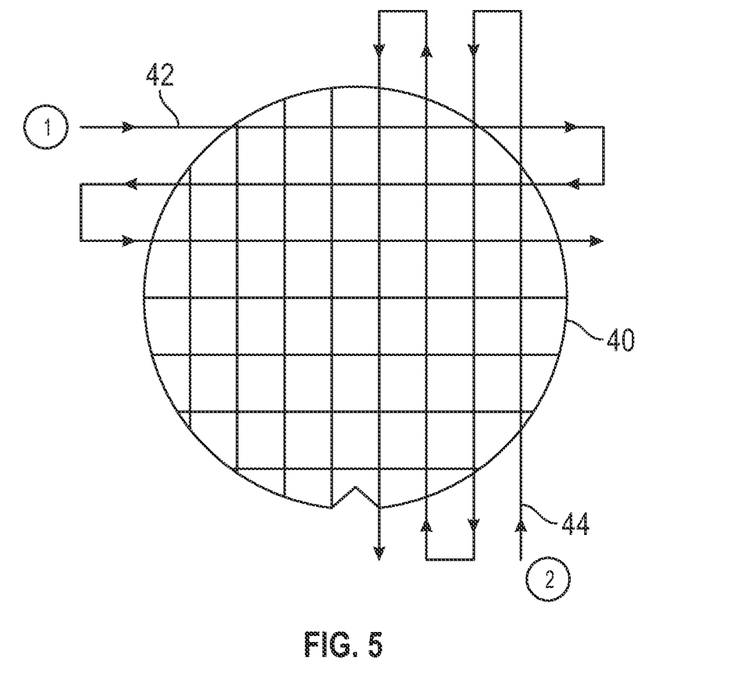
FIG. 5 is a top view of another singulation path implementation over the surface of a semiconductor substrate with a plurality of die streets formed therein.

In others singulation path implementations, however the use of simultaneously operating fluid jets may result in the ability to cut a semiconductor substrate 40 in both the horizontal and vertical directions along the die streets at the same time. In such implementations, each fluid jet may move independently from the other fluid jet. However, in some implementations, the movement of both fluid jets may be coordinated by the same mechanism, thus linking the movement of each of the fluid jets. As illustrated in FIG. 5 by indicator 1, fluid jet 42 travels and singulates the horizontally oriented die streets while fluid jet 44 travels and simultaneously singulates the vertically oriented die streets as indicated by indicator 2.

The ability to singulate using fluid jets in non-parallel directions may be useful when singulating thinned die or other die where relieving stress during the singulation process may assist in reducing cracking of the die. The ability to singulate beginning at one corner of a rectangular die and ending at the opposing corner of the same rectangular die may result in a singulation process that minimizes as much as possible the strain on the corners of the die during the singulation process. Reducing the strain on the die reduces the likelihood that the corner of the die will chip or crack during the singulation process. A similar effect may be observed if a semiconductor die is singulated beginning at one corner and ending at the same corner of the die. The ability to singulate a die at a time or die-by-die may be particularly useful for thinned die which have a greater likelihood to crack or chip due to the thin nature of the semiconductor substrate. The principles disclosed herein may also be used to singulate non-rectangular die such as, by non-limiting example, triangular, pentagonal, hexagonal, or any other closed shape. Various implementations of die-by-die singulation paths, zigzag singulation paths, and one-die-at-a-time singulation paths are disclosed in this document.

Figure 6:
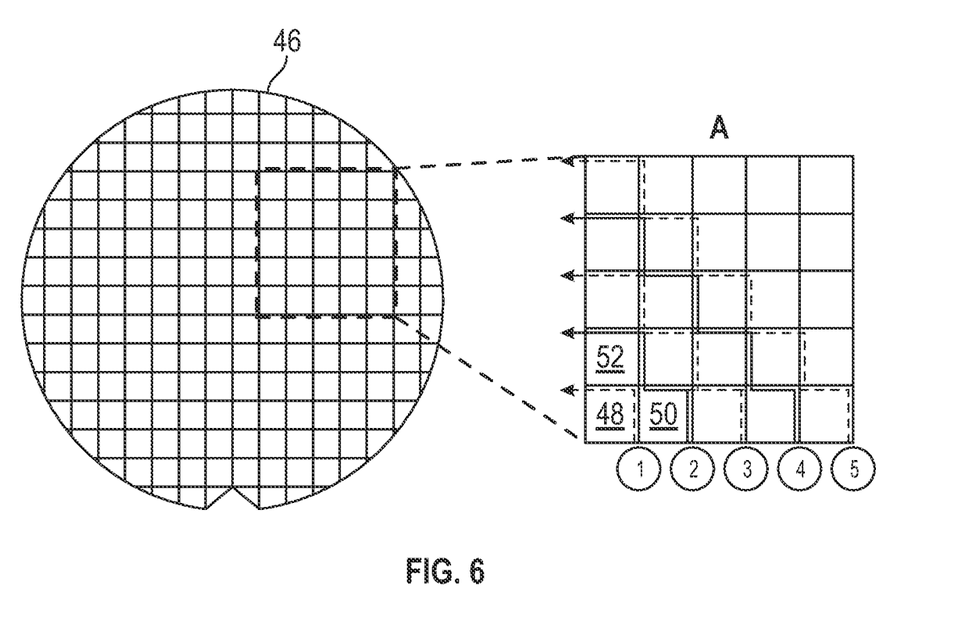
FIG. 6 is a top detail view of a singulation path implementation over a plurality of die streets formed in the surface of a semiconductor substrate implementation.

Referring to FIG. 6, an implementation of a semiconductor substrate 46 is illustrated with a detailed view A illustrated on the right. The detail view includes a plurality of die 48, 50, 52 separated by die streets. In this implementation, a fluid jet makes a first pass illustrated by the dotted line and indicator 1 that singulates the vertical die street between die 48 and 50 and the horizontal die streets between die 48 and 52. A fluid jet (see solid line and indicator 2) is then used to singulate the other vertical die street of die 50, the horizontal die street of die 50, the vertical die street of die 52, and the horizontal die street of die 52. In the process, the fluid jet completes the singulation process of the adjacent die corners of die 52, 50 at the same time as the fluid jet zigzags along the die streets. The same process is repeated for the paths labeled with indicators 3, 4, and 5 across the entire surface of the semiconductor substrate resulting eventually in singulation of all of the die on the simulator substrate 46. Because the die are singulated in a zigzag fashion, expansion of the support material such as a singulation tape during the singulation process may be significantly reduced. Where the plurality of die are singulated in rows and then separately in columns, the singulation support material (tape, etc.) supporting the plurality of die during singulation has the tendency to spread which can cause additional stress on the singulated or unsingulated die or reduce the accuracy of the singulation process in various implementations. By using a zigzag approach the ability of the support material to expand during singulation may be significantly reduced and/or eliminated. In singulation path implementations like that illustrated in FIG. 6 the same fluid jet may be used to cut each zigzag pattern or multiple fluid jets may be used to cut the patterned. Also, in various implementations, multiple passes along each zigzag path with each fluid jet may be employed.

Figure 7:
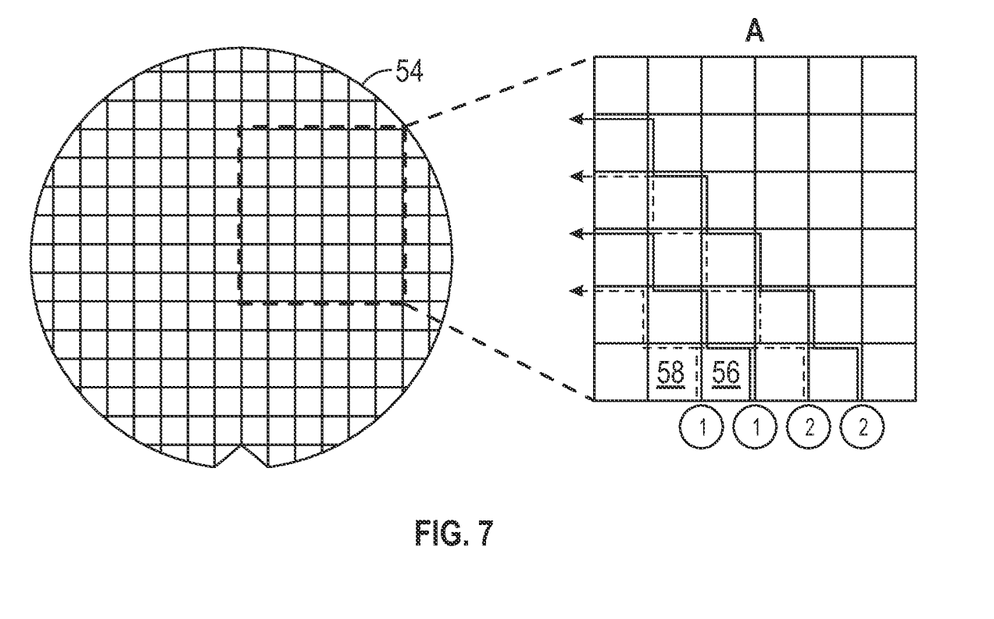
FIG. 7 is a top detail view of another singulation path implementation over a plurality of die streets formed in the surface of a semiconductor substrate implementation.

Referring to FIG. 7, another implementation of the singulation path is illustrated in detail view A for substrate 54. In this implementation, two fluid jets simultaneously singulate the plurality of die in corresponding zigzag patterns cutting alternate vertical and horizontal portions of the die streets between the die. As illustrated in FIG. 7, the use of simultaneous cutting allows for the simultaneous singulation of the vertical streets of die 56 followed by the simultaneous singulation of the horizontal die street of die 56 and die 58. In this implementation the result is that, when the horizontal die street for die 56 is fully singulated, it reaches the already vertically singulated die street at the die corner. This may assist in reducing the stress during the singulation process on die 56. As illustrated in FIG. 7, the pair of fluid jets may then carry out zigzag singulation for the next adjacent die over thereby singulating diagonal rows of die at a time. The ability to use due dual or multiple singulation in a zigzag fashion may increase the run rate and further reduce stress on the die during a singulation process.

Figure 8:
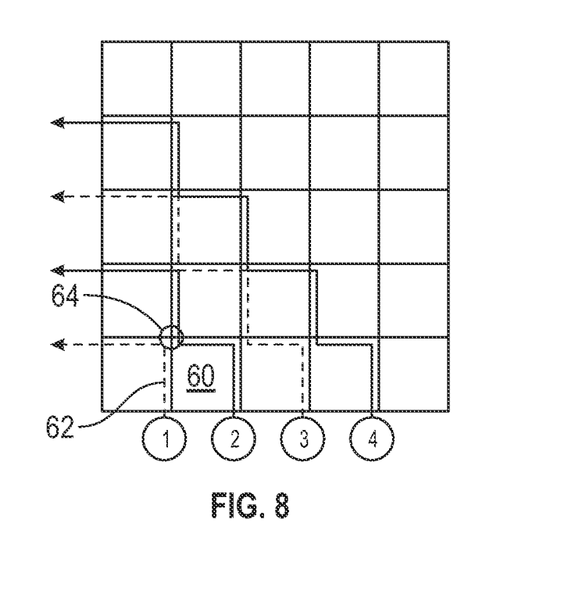
FIG. 8 is a detail view of another singulation path implementation over a plurality of die streets.

Referring to FIG. 8, a detailed view for a semiconductor substrate is illustrated that illustrates an implementation of a singulation path where two fluid jets are timed such that as the vertical die street for die 60 is being singulated by path to indicated by indicator 1, the horizontal die street is also being singulated by the other fluid jet. The two fluid jets ultimately both reach die corner 64 of die 60 simultaneously as they cut the vertical and horizontal part of the corner 64 simultaneously. In such an implementation of a method of singulation, the effect is that the fluid jets do not cut parallel lines next to each other but they cut an intersecting pattern alternately crossing each other's paths as each die is singulated. The net effect is that the fluid jets begin cutting at one corner of the die and simultaneously finish cutting that same die at the diagonally opposing corner of the die. The two fluid jets thus cut each die out in a zigzag fashion, one die at a time. This ensures that the die corners at the points where both cutting begins and ends are singulated at the same time. The ability to singulate the die corners at the same time may further reduce the stress or strain on the die corners and thereby prevent die chipping and/or cracking. The effect of this intersecting operation of the fluid jets can be seen in the movement of the paths and in the second pass that begins adjacent to the die 60 as indicated by indicators 3 and 4.

Figure 9:
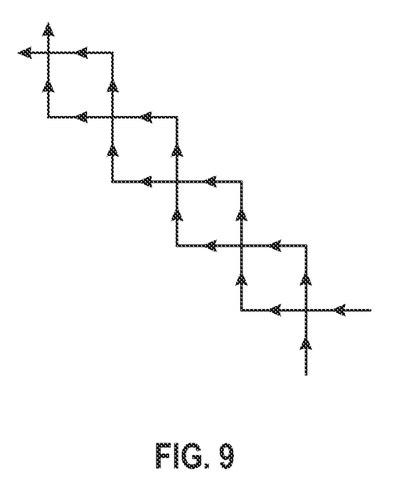
FIG. 9 is a diagram view of another singulation path implementation that moves to the left along a plurality of die streets formed in a semiconductor substrate implementation.
Figure 10:
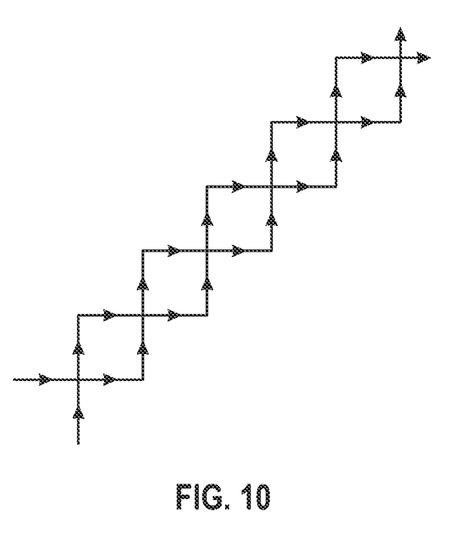
FIG. 10 is a diagram view of another singulation path implementation that moves to the right along a plurality of die streets formed in a semiconductor substrate implementation.

This use of intersecting fluid jets to cut during die singulation can proceed either to the left as illustrated by the diagram in FIG. 9 or to the right as illustrated by the diagram illustrated in FIG. 10. In this way the die are singulated using a die-by die zigzag pattern using two fluid jets. In various implementations however, more than two intersecting fluid jets may be employed in the fluid jets may move in the same left-wise or right-wise orientation, in the opposite direction, or in a diagonally oriented direction depending upon the method of limitation.

Figure 11:
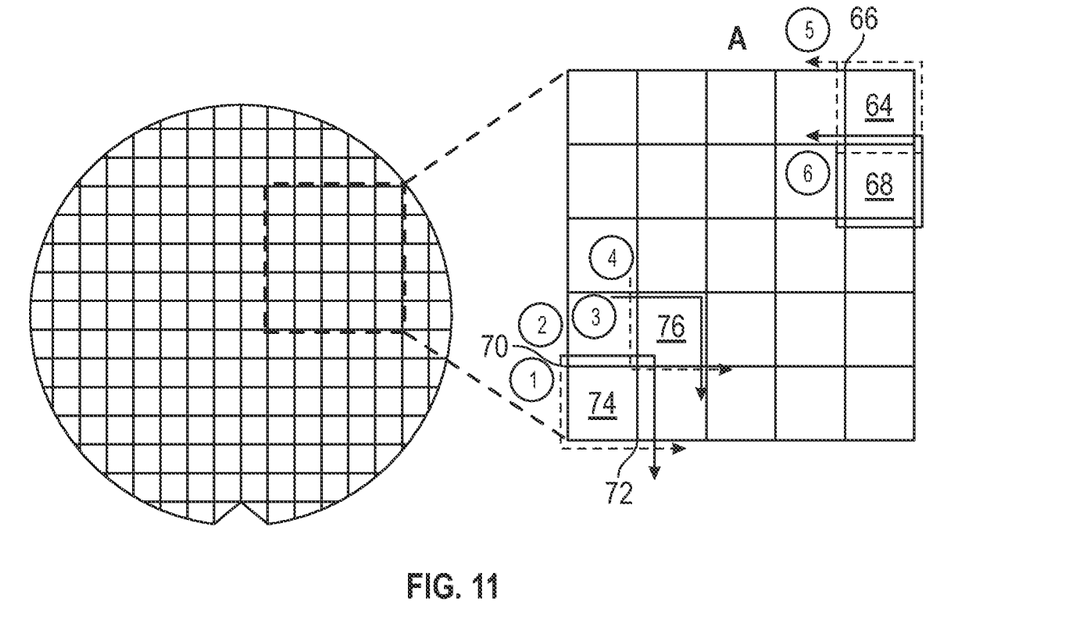
FIG. 11 is a top detail view of another singulation path implementation over a plurality of die streets formed in a semiconductor substrate implementation.

While thus far the use of simultaneous adjacent or intersecting fluid jets in a singulation path has been discussed, in other implementations, the fluid jets may be independently directed to singulate one die at a time singulating around all corners of the die before moving on to the next time as illustrated in the detail view A in FIG. 11. As illustrated in the upper right corner of detail view A, the fluid jet indicated by indicator 5 begins at the top right corner 66 of die 64 and then proceeds in a counterclockwise fashion around the perimeter of the die eventually returning to corner 66, thus cutting die 64 out by itself. Following the singulation of die 64, the fluid jet returns (as indicated by indicator 6) to cut out die 68 in a similar fashion. In various implementations during cutting of die 68 the fluid jet may retrace over the previously singulated common horizontal die streets between die 64 and die 68; in other implementations however, the operation of the fluid jet may cease during the cutting of any previously singulated street thus preventing double singulation.

The lower right corner of detail view A of FIG. 11 illustrates another die singulation path implementation. In this implementation, two fluid jets indicated by indicators 1 and 2 began at corner 70 and then proceed to simultaneously cut the horizontal and vertical die streets eventually arriving at corner 72 of die 74. In this way, only die 74 is cut out using the two intersecting fluid jets. The position of the two fluid jets is then moved to the next die to the upper right as indicated by indicators 3 and 4 and the process is repeated to cut out die 76. In this way the intersecting fluid jets are used to cut out one die at a time in any desired pattern on the semiconductor substrate. In various implementations, as previously discussed, the operation of a fluid jet that passes along a previously cut die street may be suspended to prevent double singulating of a particular die street.

A wide variety of fluid jet-based zigzag and single die at a time singulation path and methods may be constructed using the principles of this disclosure. While the principles herein have been illustrated in the context of the use of fluid jets, in other implementations however, the same singulation paths may be employed when laser ablation/cutting is employed as a die singulation method. In such implementations, all of the principles disclosed in the foregoing examples for fluid jets may be simultaneously applied to laser beams and laser beam singulation paths in such implementations. Lasers may also be used to construct singulation that implementations like those disclosed herein for die that have die supports coupled thereto to cut through the material of the die and through the die support as already disclosed herein. Those of ordinary skill the art will readily be able to construct various singulation methods employing fluid jets and/or lasers for die singulation using the principles disclosed herein.

While in the various method implementations disclosed herein, the use of a fluid jet or laser to fully singulate a semiconductor substrate and/or a die support has been disclosed, in various other method implementations, the same principles may be applied when the thickness of the semiconductor substrate has been first fully or partially singulated using a plasma etching process and the remaining material in the die street is a backmetal layer formed on the semiconductor substrate and/or residual unetched structures in the die street, such as, by non-limiting example, alignment features, electrical testing structures, oxides, metals, silicon oxide, or other remaining structures or materials. In such implementations, any of the method implementations and processes disclosed herein that use any fluid jet type disclosed herein, including one that includes an etchant, or laser ablation may be employed to finish the singulation process using any of the disclosed singulation path implementations.

In places where the description above refers to particular implementations of singulation systems and related met and implementing components, sub-components, methods and sub-methods, it should be readily apparent that a number of modifications may be made without departing from the spirit thereof and that these implementations, implementing components, sub-components, methods and sub-methods may be applied to other singulation systems and related methods.

What is claimed is:

1. A semiconductor substrate singulation process comprising:
    applying a first fluid jet to a material of a die street of a first plurality of die streets comprised in a semiconductor substrate, the semiconductor substrate further comprising:
        a plurality of die separated by the first plurality of die streets and a second plurality of die streets; and
        a plurality of die support structures coupled thereto;
    applying a second fluid jet to a material of a die street of the second plurality of die streets comprised in the semiconductor substrate; and
    singulating the plurality of die and the plurality of die support structures at the first plurality of die streets and the second plurality of die streets using the first fluid jet and the second fluid jet simultaneously;
    wherein the first fluid jet is moved only along a length of the die street of the first plurality of die streets;
    wherein each die of the plurality of die is singulated using both the first fluid jet and the second fluid jet; and
    wherein the first fluid jet removes the material of the die street of the first plurality of die streets having a thickness equal to a thickness of the semiconductor substrate.

2. The process of claim 1, wherein the first fluid jet is moved by moving the semiconductor substrate.

3. The process of claim 1, wherein the first fluid jet is moved by moving the first fluid jet relative to the semiconductor substrate.

4. The process of claim 1, wherein the plurality of die support structures comprises a mold compound.

5. The process of claim 1, wherein the first fluid jet comprises a plurality of particles.

6. The process of claim 1, wherein the first fluid jet is pulsed at a predetermined frequency.

7. Process of claim 1, further comprising repeatedly applying the first fluid jet to the material of the die street of the first plurality of die streets prior to singulating the plurality of die and the plurality of die support structures.

8. The process of claim 1, wherein a spacing between the first fluid jet and the second fluid jet is a distance equal to a pitch of one of the plurality of die or a plurality of packages.

9. A semiconductor substrate singulation process comprising:
   applying one of a first fluid jet or a first laser beam to a material of a die street of a first plurality of die streets comprised in a semiconductor substrate, the semiconductor substrate comprising a plurality of die separated by the first plurality of die streets and a second plurality of die streets;
   applying one of a second fluid jet or a second laser beam to a material of a die street of the second plurality of die streets; and
   die-by-die singulating the plurality of die at the first plurality of die streets and the second plurality of die streets using the one of the first fluid jet or the first laser beam and one of the second fluid jet or the second laser beam;
   wherein one of the first fluid jet or the first laser beam singulates the plurality of die by removing the material of the die street having a thickness equal to an entire thickness of the semiconductor substrate; and
   wherein die-by-die singulating comprises intersecting one of the first fluid jet or the first laser beam with the one of the second fluid jet or the second laser beam at a beginning of singulating and at an end of singulating each die of the plurality of die.

10. The process of claim 9, further comprising coupling a plurality of die support structures to the plurality of die.

11. The process of claim 10, wherein the plurality of die support structures and the plurality of die form a plurality of semiconductor packages.

12. The process of claim 9, wherein the first fluid jet comprises a plurality of particles.

13. A semiconductor substrate singulation process comprising:
   applying one of a first fluid jet or a first laser beam to a material of a die street of a first plurality of die streets comprised in a semiconductor substrate, the semiconductor substrate comprising a plurality of die separated by the first plurality of die streets and a second plurality of die streets;
   applying one of a second fluid jet or a second laser beam to a material of a die street of the second plurality of die streets comprised in the semiconductor substrate; and
   zigzag singulating the plurality of die at the first plurality of die streets and second plurality of die streets by removing an entire thickness of the material of the die street of the first plurality of die streets using one of the first fluid jet or the first laser beam and removing an entire thickness of the material of the die street of the second plurality of die streets using one of the second fluid jet or the second laser beam;
   wherein one of the first fluid jet or the first laser beam and one of the second fluid jet or the second laser beam are both used to zigzag singulate each die of the plurality of die.

14. The process of claim 13, further comprising coupling a plurality of die support structures to the plurality of die.

15. The process of claim 14, wherein the plurality of die support structures and the plurality of die form a plurality of semiconductor packages.

16. The process of claim 13, wherein zigzag singulating further comprises intersecting one of the second fluid jet or the second laser beam with one of the first fluid jet or the first laser beam at a beginning of singulating and at an end of singulating each die of the plurality of die.

17. The process of claim 13, wherein the first fluid jet comprises a plurality of particles.

* * * * *